United States Patent [19]

Baxter et al.

[11] Patent Number: 4,855,007

[45] Date of Patent: Aug. 8, 1989

[54] AUTOMATIC DIE ATTACH WORKHOLDER

[75] Inventors: Marjorie S. Baxter, Mesa, Ariz.;
Timothy C. Wilson, Rancho, Calif.

[73] Assignee: Motorola Inc., Schaumburg, Ill.

[21] Appl. No.: 201,973

[22] Filed: Jun. 3, 1988

[51] Int. Cl.⁴ .............................................. B23K 1/04
[52] U.S. Cl. .................................... 156/378; 156/381;
228/4.1; 228/8; 228/103; 228/219
[58] Field of Search ................... 156/381, 64, 378;
228/4.1, 103, 104, 4.5, 8, 219, 218, 220

[56] References Cited

U.S. PATENT DOCUMENTS

| | | | |
|---|---|---|---|
| 3,173,610 | 3/1965 | Feibush et al. | 236/44 |
| 3,695,501 | 10/1972 | Radobenko | 228/3 |
| 3,762,015 | 10/1973 | Radobenko | 29/203 V |
| 3,840,163 | 10/1974 | Diepeveen | 226/64 |
| 3,900,145 | 8/1975 | Diepeveen | 228/4.1 |
| 3,949,926 | 4/1976 | Diepeveen | 228/47 X |
| 4,140,266 | 2/1979 | Wagner | 228/8 X |
| 4,378,168 | 3/1983 | Kuisma | 73/599 X |
| 4,589,274 | 5/1986 | Boyle et al. | 73/29 |
| 4,614,292 | 9/1986 | Polansky et al. | 228/3.1 X |

Primary Examiner—David Simmons
Attorney, Agent, or Firm—Joe E. Barbee; Raymond J. Warren

[57] ABSTRACT

A workholder having top and bottom frame portions defining a cavity through which a leadframe passes is described. Dew point, moisture, ports are placed in one of the top or bottom frame portions to allow continuous, real time monitoring of the moisture level in the processing environment. A series of clamping an indexing means are integrally disposed within the frame portions of the workholder to clamp and index the leadframes.

14 Claims, 3 Drawing Sheets

AUTOMATIC DIE ATTACH WORKHOLDER

BACKGROUND OF THE INVENTION

The present invention relates, in general, to a workholder for an automatic die bonder and, more particularly, to an environmentally sealed and monitored workholder for an automatic die bonder.

Currently, there are several workholders in the industry. One such workholder is the one provided with the FOTON 8030A originally produced by FOTON, Inc. In the die bonding process, a semiconductor die is typically bonded to a substrate. This substrate may be the die flag of a leadframe, a heatsink, or other element. The bonding is typically accomplished by placing a bonding agent, such as an epoxy or solder, onto the substrate. The die is then disposed on the bonding agent to secure it to the substrate.

A problem that has developed in this processing sequence is that of moisture entering the system. This can prevent the bonding agent from adhering to the substrate by allowing the substrate to oxidize. An additional problem is that of the moisture allowing the bonding pads of the die to oxidize. This will prevent later lead bonding processes from functioning properly.

In normal die bonding operation, the detection of moisture as a problem can be made only after a problem develops. This means that during a processing run, the oxidation on the devices becomes progressively worse until it is evident to an operator because of an obvious defect in the part. At that point the machine is required to be shut down and inspected to see where the leak occurred and rectify the situation.

Accordingly, it is an object of the present invention to provide a workholder that overcomes the above deficiencies.

Another object of the present invention is to provide a workholder which is monitored to detect moisture in the system.

Still another object of the present invention is to provide a workholder that is environmentally isolated during processing.

The above and other objects and advantages of the present invention are provided by the workholder described herein.

SUMMARY OF THE INVENTION

A particular embodiment of the present invention consists of a workholder having top and bottom frame portions defining a cavity therebetween. Through the cavity are transmitted a leadframe to which a semiconductor die is to be bonded. Dew point, moisture, ports are placed in one of the top or bottom frames to allow continuous, real time monitoring of the moisture in the processing environment. When a maximum dew point is exceeded, an operator can be notified and the system shut down.

In addition, a series of clamps for use in clamping the leadframes to the bottom frame are integrally disposed in the workholder. Further, a series of indexing apparatus are integrally disposed on the top frame of the workholder.

DETAILED DESCRIPTION OF THE DRAWINGS

Figure 1:
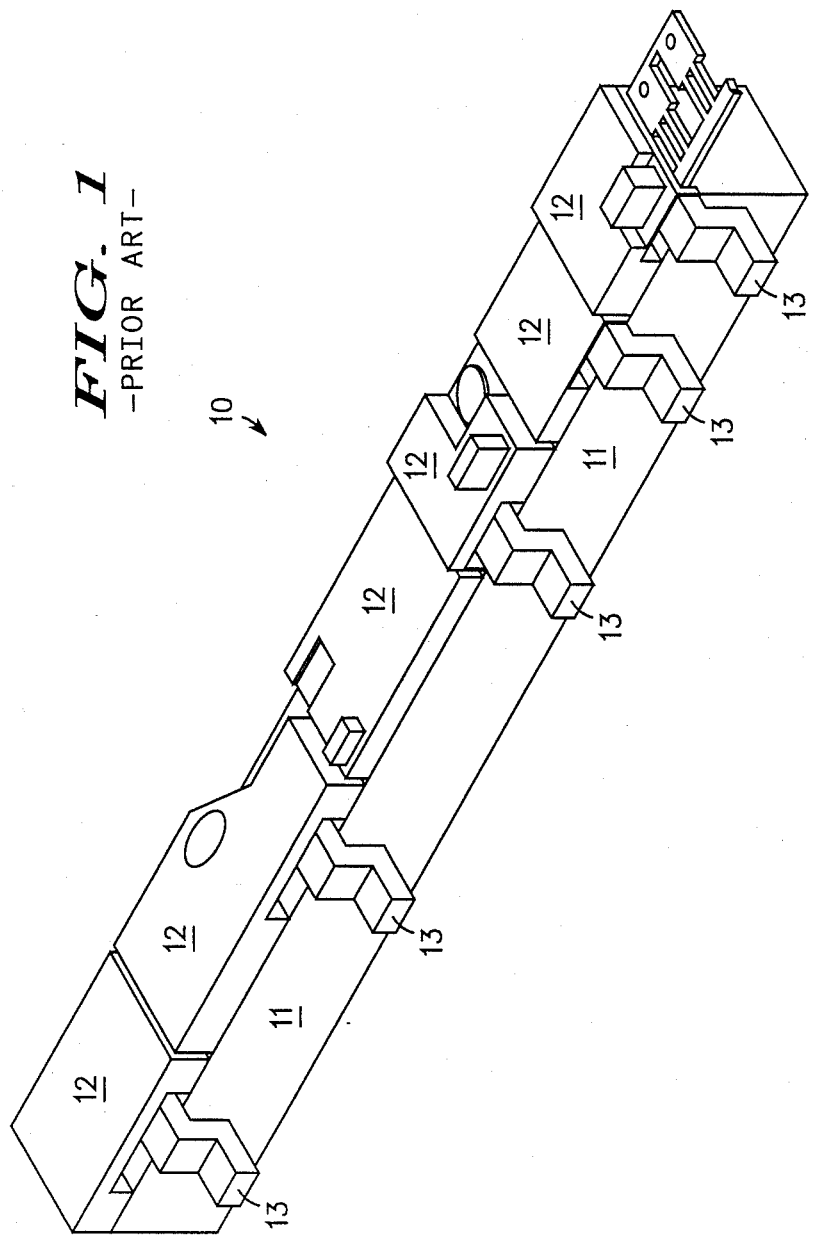
FIG. 1 is a perspective view of a prior art workholder.

Referring initially to FIG. 1, a prior art die bond workholder, generally designated 10, is illustrated. Workholder 10 consists generally of a base heating plate 11, a variety of cover plates 12, and clamps 13. In the die bonding process it is important that the chamber in which the bonding takes place be essentially free of moisture.

As can be seen in FIG. 1, there are many mating surfaces between the plurality of cover plates 12. In addition, there are openings in the sides of workholder 10 to allow the entrance of clamps 13. All of these openings allow the forming gas (95% nitrogen, 5% hydrogen) to escape and be replaced by the outside environment. This outside environment contains moisture which will prevent solder from wetting to the die position on the leadframe and can oxidize the bonding pads on the die.

With workholder 10, if a problem develops in bonding the dice to the leadframe, the whole system is shutdown. A pipe is the inserted through one end of workholder 10 and readings are taken at various points throughout the cavity. This can then be reviewed to determine if moisture was causing the problem. This is a post facto process which can take a great deal of processing time to perform.

Figure 2A:
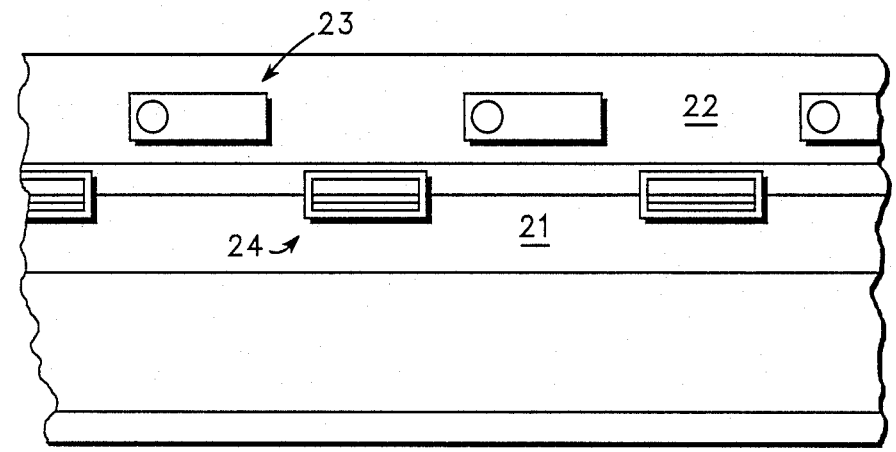
FIGS. 2A, and 2B are perspective views of a workholder embodying the present invention.
Figure 2B:
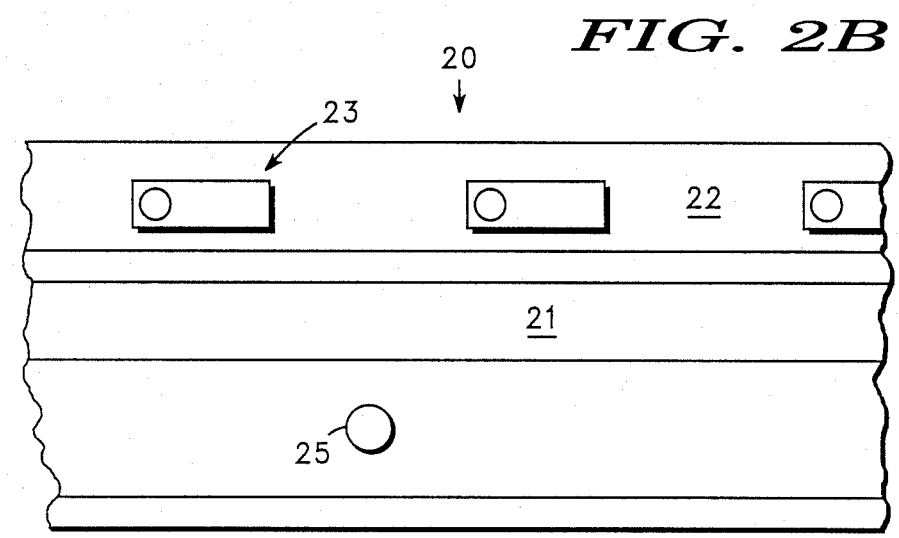

Referring now to FIGS. 2A and 2B, a workholder, generally designated 20, embodying the present invention is illustrated. Workholder 20 consists of a base heating plate 21, a solid cover plate 22, indexing means 23, clamping mean 24, and a dew point port 25. In operation, workholder 20 maintains an isolation between the inner cavity and the outside environment. This prevents the entrance of moisture from the outside environment.

Figure 3:
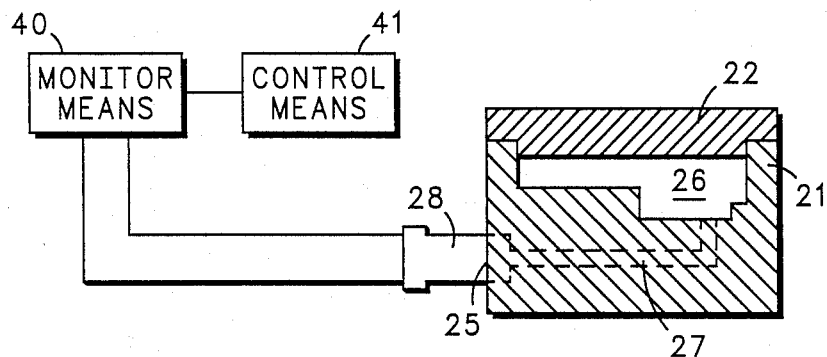
FIG. 3 is a cross-sectional view of the workholder of FIG. 2 illustrating a dew point port.

A cross-sectional view of workholder 20 is illustrated in FIG. 3. A cavity 26 is formed between cover 22 and base plate 21. An opening 27 is formed in plate 21 which couples port 25 to cavity 26. A dew point monitor 40 can then be coupled to port 25 through connector 28. An example of a dew point detector used in monitor 40 is one such as described in U.S. Patent No. 4,589,274 issued to Boyle et al. This will permit continuous moitoring of the moisture in cavity 26 during the die bond operation. Moisture in the system can then b detected before it creates a processing problem. By placing several dew point connectors 28 through out the length of workholder 20, the point at which moisture enters the system can be identified.

Dew point monitor 40 can be used to notify an operator in several ways. Monitor 40 can provide a readout which must be by the operator. Another alternative is to have moniter 40 sound an alarm if a maximum moisture point is reached. A further alternative is to couple monitor 40 directly into a control means 41 of the die bonder. If a maximum moisture level is reached, control means 41 will automatically shut down the die bonder.

Figure 4:
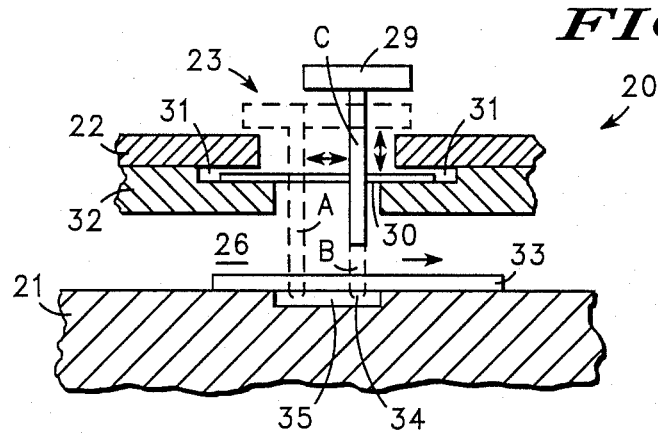
FIG. 4 is a cross-sectional view of the workholder of FIG. 2 illustrating an indexer.

In the die bonding process, it is necessary to index the leadframes from station to station. It is beneficial if this can be accomplished in an integral fashion with workholder 20 in order to prevent moisture from entering the system. In FIG. 4, an indexing means, generally designated 23, is illustrated. Indexing means 23 consists primarily of a pin 29 and a baffle 30. Baffle 30 is disposed in an indexing baffle opening 31 defined by cover 22 and a baffle retaining plate 32. This allows baffle 30 to move parallel to the flow of a leadframe 33.

In operation, an actuator will lower pin 29 into an opening 34 in leadframe 33, position A. A groove 35 is provided in base 21 such that pin 29 may extend through leadframe 33. Pin 29 will then move parallel to leadframe 33 causing leadframe 33 to be indexed forward, position B. Pin 29 is then raised, position C, and returned to the starting point, position A. The fit of pin 29 to baffle 30 and baffle 30 to opening 31 are precisely machined in order to provide a tight fit. Any leaks that may result from this will result in some of the forming gas escaping from cavity 26 rather than letting the outside environment.

Indexing means 23 may also be provided with seals, such as o-rings, between baffle 30 and cover 22 and between plate 32 and baffle 30.

Figure 5:
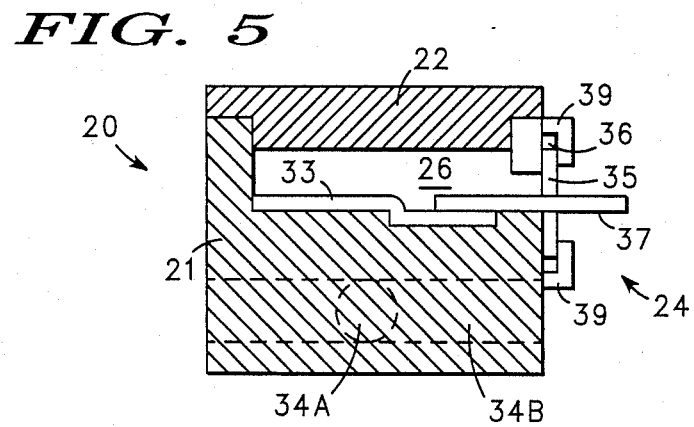
FIG. 5 is a cross-sectional view of the workholder of FIG. 2 illustrating a leadframe clamp.

Another item required to operate a die bonder is a clamping means 24. Clamping means 24 is illustrated in more detail in FIG. 5. Clamping means 24 is required to maintain contact between leadframe 33 and base heating plate 21. Plate 21 has various thermodes 34A and 34B disposed throughout plate 21. Thermodes 34A and 34B are used to heat leadframe 33 to facilitate the bonding of leadframe 33 to a die.

Clamping means 24 consists of: a clamping baffle 35 disposed in a clamping baffle opening 36 formed by plate 21 and a retaining bracket 39; and a clamping arm 37. When leadframe 33 is to be moved forward, an actuator raises arm 37. This releases leadframe 33 which is then indexed. Once indexed, clamping arm 37 is lowered and leadframe 33 is again disposed against plate 21.

Clamping means 24 is also designed to act as an integral part of workholder 20 to prevent moisture from entering cavity 26. This is accomplished by machining baffle 35 so there is a precise fit between the moving components. Again, as with indexing means 23, seals may be disposed between baffle 35 and plate 21 and between bracket 39 and baffle 35.

Thus, it will be apparent to one skilled in the art that there has been provided in accordance with the invention, a device that fully satisfies the objects, aims, and advantages set forth above.

While the invention has been described in conjunction with specific embodiments thereof, it will be evident that many alterations, modifications, and variations will be apparent to those skilled in the art in light of the foregoing description. Accordingly, it is intended to embrace all such alterations, modifications, and variations in the appended claims.

We claim:

1. A workholder for use with a semiconductor die bonder comprising:
    a base plate having a first surface;
    a cover coupled to said first surface of said base plate defining a cavity therebetween; and
    monitoring means for monitoring the moisture level in the cavity formed between said base plate and said cover, said monitoring means being coupled to a port in one of said base plate and said cover.

2. The workholder of claim 1 further comprising an indexing means for indexing a leadframe through the cavity formed between said base plate and said cover.

3. The workholder of claim 2 wherein said indexing means comprises:
    a retaining plate coupled to said cover, said retaining plate and cover defining an indexing baffle opening therebetween, said retaining plate further defining an indexing opening therethrough;
    said cover defining an indexing opening therethrough coincident with the indexing opening of said retaining plate;
    an indexing baffle being slideably disposed in the indexing baffle opening defined by said retaining plate and said cover, said indexing baffle defining an opening therethrough; and
    an indexing pin slideably disposed in the opening of said indexing baffle.

4. The workholder of claim 1 further comprising clamping means for clamping a leadframe to said first surface of said base plate.

5. The workholder of claim 4 wherein said clamping means comprises:
    said base plate defining a clamping opening therethrough;
    a retaining bracket coupled to said base plate, said retaining bracket and said base plate defining an clamping baffle opening therebetween, said retaining bracket further defining a clamping opening therethrough;
    a clamping baffle being slideably disposed in the clamping baffle opening defined by said base plate and said retaining bracket, said clamping baffle defining an opening therethrough; and
    a clamp being disposed in the opening of said clamping baffle 6. A workholder for use with a semiconductor die bonder comprising:
    a base plate having a first surface;
    a cover coupled to said first surface of said base plate defining a cavity therebetween;
    monitoring means for monitoring the moisture level in the cavity formed between said base plate and said cover, said monitoring means being coupled to a port in one of said base plate and said cover; and
    control means for controlling the operation of said die bonder, said control means being coupled to an output of said mnitoring means.

7. The workholder of caim 6 further comprising an indexing means for indexing a leadframe through the cavity formed between said base plate and said cover.

8. The workholder of claim 7 wherein said indexing means comprises:
    a retaining plate coupled to said cover, said retaining plate and cover defining an indexing baffle opening therebetween, said retaining plate further defining an indexing opening therethrough;
    said cover defining an indexing opening therethrough coincident with the indexing opening of said retaining plate;
    an indexing baffle being slideably disposed in the indexing baffle opening defined by said retaining plate and said cover, said indexing baffle defining an opening therethrough; and
    an indexing pin slideably disposed in the opening of said indexing baffle.

9. The workholder of claim 6 further comprising clamping means for clamping a leadframe to said first surface of said base plate.

10. The workholder of claim 9 wherein said clamping means comprises:
- said base plate defining a clamping opening therethrough;
- a retaining bracket coupled to said base plate, said retaining bracket and said base plate defining an clamping baffle opening therebetween, said retaining bracket further defining a clamping opening therethrough;
- a clamping baffle being slideably disposed in the clamping baffle opening defined by said base plate and said retaining bracket, said clamping baffle defining an opening therethrough; and
- a clamp being disposed in the opening of said clamping baffle.

11. A workholder for use with a semiconductor die bonder comprising:
- a base plate having a first surface;
- a cover coupled to said first surface of said base plate defining a cavity therebetween;
- monitoring means for monitoring the moisture level in the cavity formed between said base plate and said cover, said monitoring means being coupled to a port in one of said base plate and said cover;
- indexing means for indexing a leadframe through the cavity formed between said base plate and said cover; and
- clamping means for clamping said leadframe to said first surface of said base plate.

12. The workholder of claim 11 further comprising control means for controlling the operation of said die bonder, said control means being coupled to an output of said monitoring means.

13. The workholder of claim 11 wherein said indexing means comprises:
- a retaining plate coupled to said cover, said retaining plate and cover defining an indexing baffle opening therebetween, said retaining plate further defining an indexing opening therethrough;
- said cover defining an indexing opening therethrough coincident with the indexing opening of said retaining plate;
- an indexing baffle being slideably disposed in the indexing baffle opening defined by said retaining plate and said cover, said indexing baffle defining an opening therethrough; and
- an indexing pin slideably disposed in the opening of said indexing baffle.

14. The workholder of claim 11 wherein said clamping means comprises:
- said base plate defining a clamping opening therethrough;
- a retaining bracket coupled to said base plate, said retaining bracket and said base plate defining an clamping baffle opening therebetween, said retaining bracket further defining a clamping opening therethrough;
- a clamping baffle being slideably disposed in the clamping baffle opening defined by said base plate and said retaining bracket, said clamping baffle defining an opening therethrough; and
- a clamp being disposed in the opening of said clamping baffle.

* * * * *